United States Patent [19]
Yamamori

[11] Patent Number: 5,609,691
[45] Date of Patent: Mar. 11, 1997

[54] PLASMA CVD APPARATUS FOR FORMING A THIN FILM OF UNIFORM THICKNESS

[75] Inventor: Shuki Yamamori, Tokyo, Japan

[73] Assignee: NEC Corporation, Tokyo, Japan

[21] Appl. No.: 563,113

[22] Filed: Nov. 27, 1995

[30] Foreign Application Priority Data

Nov. 29, 1994 [JP] Japan .................................. 6-294859

[51] Int. Cl.$^6$ .................................................. C23C 16/00
[52] U.S. Cl. ...................... 118/723 E; 118/728; 118/500; 118/503; 204/298.15
[58] Field of Search .......................... 118/723 R, 723 E, 118/728, 500, 503; 156/345; 204/298.15

[56] References Cited

U.S. PATENT DOCUMENTS

| | | | |
|---|---|---|---|
| 3,436,255 | 4/1969 | Harris | 117/201 |
| 4,367,114 | 1/1983 | Steinberg | 156/345 |
| 4,512,841 | 4/1985 | Cunningham | 156/345 |
| 4,599,069 | 7/1986 | Murakami | 432/253 |
| 4,793,975 | 12/1988 | Drage | 422/186.05 |
| 5,262,029 | 11/1993 | Erskine | 204/298.15 |
| 5,376,180 | 12/1994 | Mahler | 118/728 |
| 5,449,411 | 9/1995 | Fukuda | 118/723 MP |
| 5,490,881 | 2/1996 | Kwasnick | 118/723 E |

FOREIGN PATENT DOCUMENTS

| | | | |
|---|---|---|---|
| 60-74534 | 4/1985 | Japan | 118/728 |
| 61-177374 | 8/1986 | Japan . | |
| 62-189725 | 8/1987 | Japan . | |
| 2-105417 | 4/1990 | Japan | 118/723 E |
| 3-187994 | 8/1991 | Japan | 118/728 |
| 6-41753 | 2/1994 | Japan | 118/723 VE |

Primary Examiner—Richard Bueker
Assistant Examiner—Jeffrie R. Lund
Attorney, Agent, or Firm—Sughrue, Mion, Zinn, Macpeak & Seas

[57] ABSTRACT

The window of a holding electrode is a rectangular opening and an insulating plate is securely fitted in this window. The insulating plate has a rectangular flange shape having a rectangular opening. A glass substrate is securely fitted in the opening of the insulating plate. While the insulating plate may be a low-cost glass plate or quartz plate, the glass plate made of the same material as the glass substrate is used. A predetermined raw gas is supplied into a reaction chamber to set the pressure therein to a predetermined level, and high-frequency power is applied between the glass substrate and the electrode. Because the peripheral portion of the glass substrate is surrounded by the insulating plate, it is possible to avoid the influence of the disturbance of the electric field which would otherwise occur at the interface between the substrate surface and the surface of the holding electrode due to the surface of the glass substrate being charged up when growing a film. This allows a film with a uniform thickness to be grown on the glass substrate.

3 Claims, 3 Drawing Sheets

PLASMA CVD APPARATUS FOR FORMING A THIN FILM OF UNIFORM THICKNESS

BACKGROUND OF THE INVENTION

1. Field of the Invention

The present invention relates to a parallel flat type plasma CVD apparatus.

2. Description of the Related Art

In the fabrication of thin-film semiconductor devices, a parallel flat type plasma CVD apparatus is used to form thin films. FIG. 1 presents a cross-sectional view of a conventional plasma CVD apparatus. Provided on the upper inner wall of a reaction chamber 5 is a heater panel 4 with its heating surface set horizontally. A metal holding electrode 2 is provided below the heater panel 4 in the reaction chamber 5. A glass substrate 1 is attached to this holding electrode 2.

The holding electrode 2 has an open center in which a window 2a for placing the glass substrate 1 is provided, as shown in FIG. 2. A small projection is provided at the lower portion of the window 2a to be used to mount the glass substrate 1 in the window 2a. A uniform heating plate 3 is placed on the glass substrate 1 and is secured to the holding electrode 2 by means of a fastener 9.

A gas guiding member 7 for guiding, for example, $SiH_4$ and $H_2$ into the reaction chamber 5 is mounted on the bottom wall of the reaction chamber 5 via an insulating member 5a. This gas guiding member 7, made of a conductive material, has a top end portion extending horizontally with multiple gas outlet holes 6a formed in the top of the top end portion. The portion where the gas outlet holes 6a are formed constitutes a high-frequency electrode 6. This high-frequency electrode 6 faces the holding electrode 2 under the holding electrode 2.

A high-frequency power supply 11 is connected to the gas guiding member 7 so that high-frequency power having an oscillation frequency of 13.56 MHz is applied via the gas guiding member 7 to the high-frequency electrode 6 from the high-frequency power supply 11.

A gas discharge port 8 is provided in the bottom wall of the reaction chamber 5, which is grounded.

According to the thus constituted conventional plasma CVD apparatus, when a raw gas is supplied into the reaction chamber via the gas guiding member 7 while the glass substrate 1 is heated by the heater panel 4, and high-frequency power is applied between the high-frequency electrode 6 and the holding electrode 2 and glass substrate 1 by the high-frequency power supply 11, an amorphous silicon film is grown on the glass substrate 1.

When a thin film is formed by this conventional plasma CVD apparatus, the peripheral portion of the glass substrate 1 is affected by the holding electrode 2 because of the difference between the surface potential of the glass substrate 1 and that of the holding electrode 2. As a result, the film thickness changes from the center portion of the substrate to its periphery, and the film thickness is not uniform.

As a solution to this problem, a technique has been proposed by which an insulating member is attached, by means of screws or the like, onto the surface of the electrode (holding electrode) located on the side where the insulator substrate is to be attached, thus ensuring a uniform electric field to provide improved uniformity of the film thickness (see Unexamined Japanese Patent Publication No. Sho 62-189725). Unexamined Japanese Patent Publication No. Sho 61-177374 proposes another technique, by which an insulating ring is attached to the peripheral portion of the electrode located opposite the substrate, for uniform plasma distribution in the discharge area and improved uniformity of the film thickness.

The former method that attaches an insulating member to the electrode surface in order to make the electric field of the entire substrate uniform at the time of forming the thin film, thus improving the film thickness distribution, also forms a film on this insulating member, which may produce particles. This method therefore requires regular cleaning of the insulating member. At the time the insulating member is cleaned, the film formed on the surface of the insulating member must be removed by a plastoprocess and etching or the like and the insulating member must then be secured again to the electrode surface by screws. It is apparent that this method requires complicated maintenance work.

Like the former method, the latter method of attaching the insulating ring to the peripheral portion of the electrode located on the side opposite the substrate also requires complicated maintenance work.

SUMMARY OF THE INVENTION

Accordingly, it is an object of the present invention to provide a plasma CVD apparatus which is easy to maintain and can form thin films with uniform thicknesses.

A plasma CVD apparatus according to this invention comprises a high-frequency electrode connected to a high-frequency power supply; a holding electrode arranged parallel to the high-frequency electrode and having a window formed in an area where a substrate on which a film is to be grown is to be secured; and a ring-shaped insulating plate having an outer peripheral portion contactable to the window and an inner peripheral portion forming an opening where the substrate is to be fitted, the insulating plate being detachably attached to the window such that the substrate contacts the inner peripheral portion.

According to this invention, the insulating plate is placed around the substrate on which a film is to be grown, in such a way as to contact the window of the holding electrode, so that the potential of the peripheral portion of the substrate is not affected by the holding electrode when growing a film, thus ensuring the uniform distribution of the film thickness. Further, it is easy to attach and manage this insulating plate, and maintenance is therefore easier.

DETAILED DESCRIPTION OF THE PREFERRED EMBODIMENTS

Figure 3:
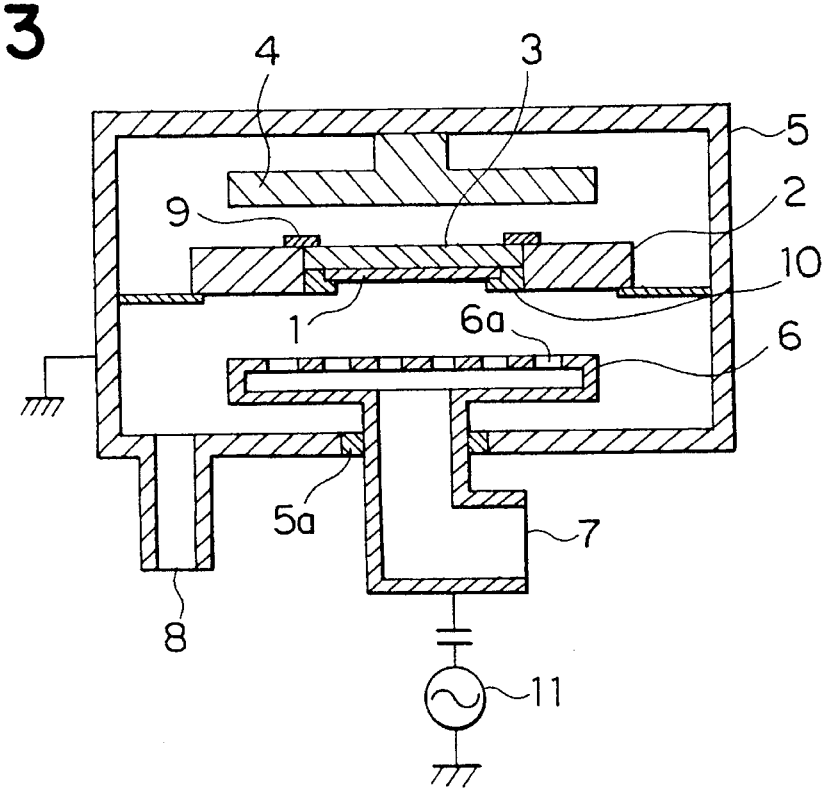
FIG. 3 is a diagram showing the structure of a first embodiment of this invention.

Preferred embodiments of the present invention will now be described referring to the accompanying drawings. FIG. 3 shows the structure of a parallel flat type plasma CVD apparatus according to the first embodiment of this invention, FIG. 4 is a cross-sectional view of a holding electrode, and FIG. 5 is a bottom view of an insulating plate.

Figure 1:
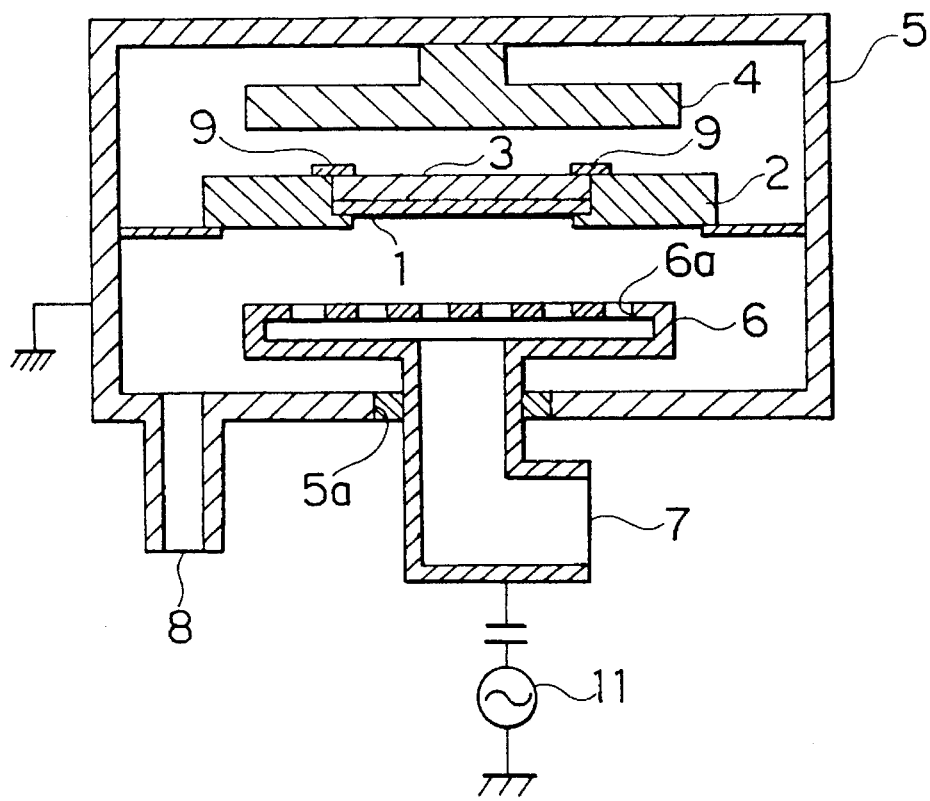
FIG. 1 is a cross-sectional view of a conventional plasma CVD apparatus.
Figure 2:
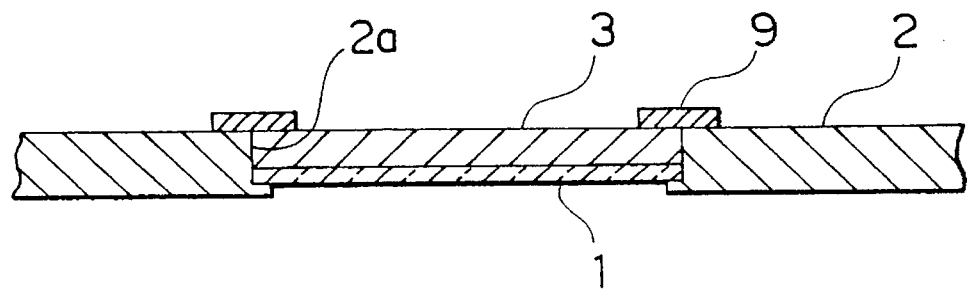
FIG. 2 is a cross-sectional view of a conventional holding electrode.

Those components in FIGS. 3 and 4 which have the same functions as the components shown in FIGS. 1 and 2 will be given the same reference numerals and symbols, so that their detailed descriptions will be avoided. A high-frequency power supply 11 is connected to the interior of a reaction chamber 5 of the plasma CVD apparatus. A high-frequency electrode 6 provided with outlet holes 6a for a reaction gas is disposed in the reaction chamber 5. Provided above this high-frequency electrode 6 is a holding electrode 2 having a window 2a in which a glass substrate 1 on which a film is to be grown is secured. A heater panel 4 is located above this holding electrode 2. A gas discharge port 8 is formed in the bottom wall of the reaction chamber 5.

Figure 4:
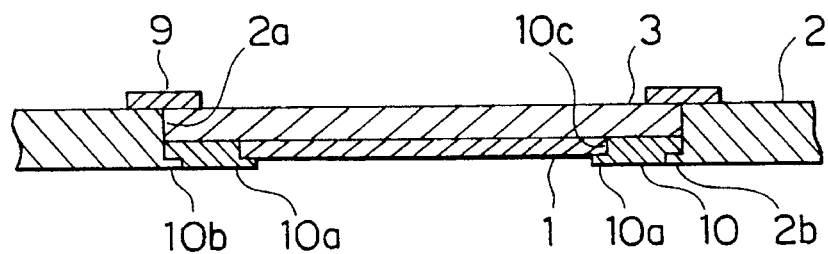
FIG. 4 is a cross-sectional view of a holding electrode of this embodiment.
Figure 5:
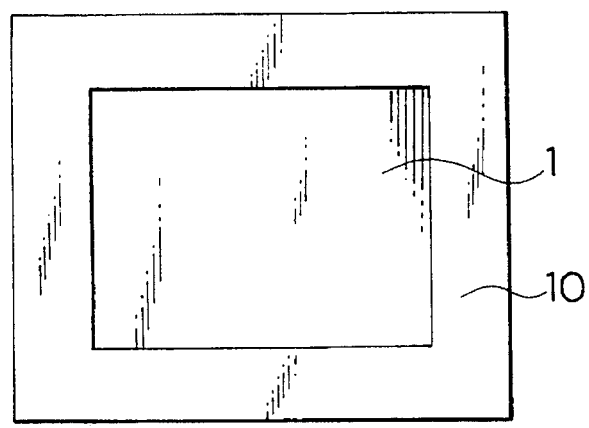
FIG. 5 is a bottom view of an insulating plate of this embodiment.

The window 2a of the holding electrode 2 is a rectangular opening as shown in FIG. 4, and a small projection 2b is provided at the lower portion of the window 2a, extending along the periphery of the opening of the window 2a. An insulating plate 10 is engaged on the small projection 2b in such a way as to be fitted in the window 2a. The insulating plate 10 has a rectangular flange shape with a rectangular opening portion 10c as shown in FIG. 4.

A small projection 10a is provided at the lower portion of the opening portion 10c, extending along the periphery of the opening portion 10c. The glass substrate 1 is placed on the small projection 10a, so that the glass substrate 1 is fitted in the opening portion 10c of the insulating plate 10. The insulating plate 10 may be a low-cost glass plate or quartz plate. The small projection 10a is located lower than the top surface of the insulating plate 10 by the thickness of the glass substrate 1, so that the top surface of the glass substrate 1 becomes flush with the top surface of the insulating plate 10 when the former is fitted on the insulating plate 10. A uniform heating plate 3 is placed on the glass substrate 1 and the insulating plate 10 while being fitted in the window 2a of the holding electrode 2. This uniform heating plate 3 is secured to the holding electrode 2 by fasteners 9.

According to the thus constituted plasma CVD apparatus of this embodiment, air inside the reaction chamber 5 is discharged via the gas discharge port 8 by a vacuum pump (not shown), and a reaction gas is supplied via a gas guiding member 7 and the gas outlet holes 6a into the reaction chamber 5. The pressure of this reaction gas is kept constant in the reaction chamber 5 by adjusting the supply amount of the reaction gas and the discharge pressure.

High-frequency power having a frequency of 13.56 MHz, for example, is applied between the holding electrode 2 and the high-frequency electrode 6 while heating the glass substrate 1 by the heater panel 4, forming plasma between both electrodes. As a result, a film is grown on the glass substrate 1.

According to this embodiment, because the peripheral portion of the glass substrate 1 is surrounded by the insulating plate 10, it is possible to avoid the influence of the disturbance of the electric field which would otherwise occur at the interface between the substrate surface and the surface of the holding electrode 2 due to the charge of the surface of the glass substrate 1 at the time of growing a film. This allows a film with a uniform thickness to be grown on the glass substrate 1. When the glass substrate 1 and the insulating plate 10 are made of the same material (glass in this case), in particular, the charge-up of the surface of the glass substrate 1 and the disturbance of the electric field at the interface between the substrate surface and the surface of the holding electrode 2 can be prevented completely.

When a film is grown on a large glass substrate whose side is 300 to 400 mm long such as the one used in a color LCD, if the entire surface of the holding electrode is covered with the insulating plate as in the prior art, problems concerning the mechanical strength and the maintenance and management of the apparatus would arise. With the use of the structure of this embodiment, however, maintenance is accomplished by simply attaching a new insulating plate 10 made of a low-cost glass plate to the window 2a of the holding electrode 2. The insulating plate 10 may be disposed of or may be recycled by a simple treatment such as etching after the replacement. It is therefore possible to form a film with a uniform thickness on the glass substrate 1 by a simpler means than is needed by the prior art. A sufficient width for the insulating plate 10 is 10 mm when a glass substrate whose side is 300 to 400 mm long is used.

When an amorphous silicon film is formed 10 nm thick on the glass substrate whose side is 400 mm using the plasma CVD apparatus of this embodiment, the variation in film thickness is ±3%, which is a significant improvement of the uniformness of the film thickness from the variation of ±20% in the prior art.

Figure 6:
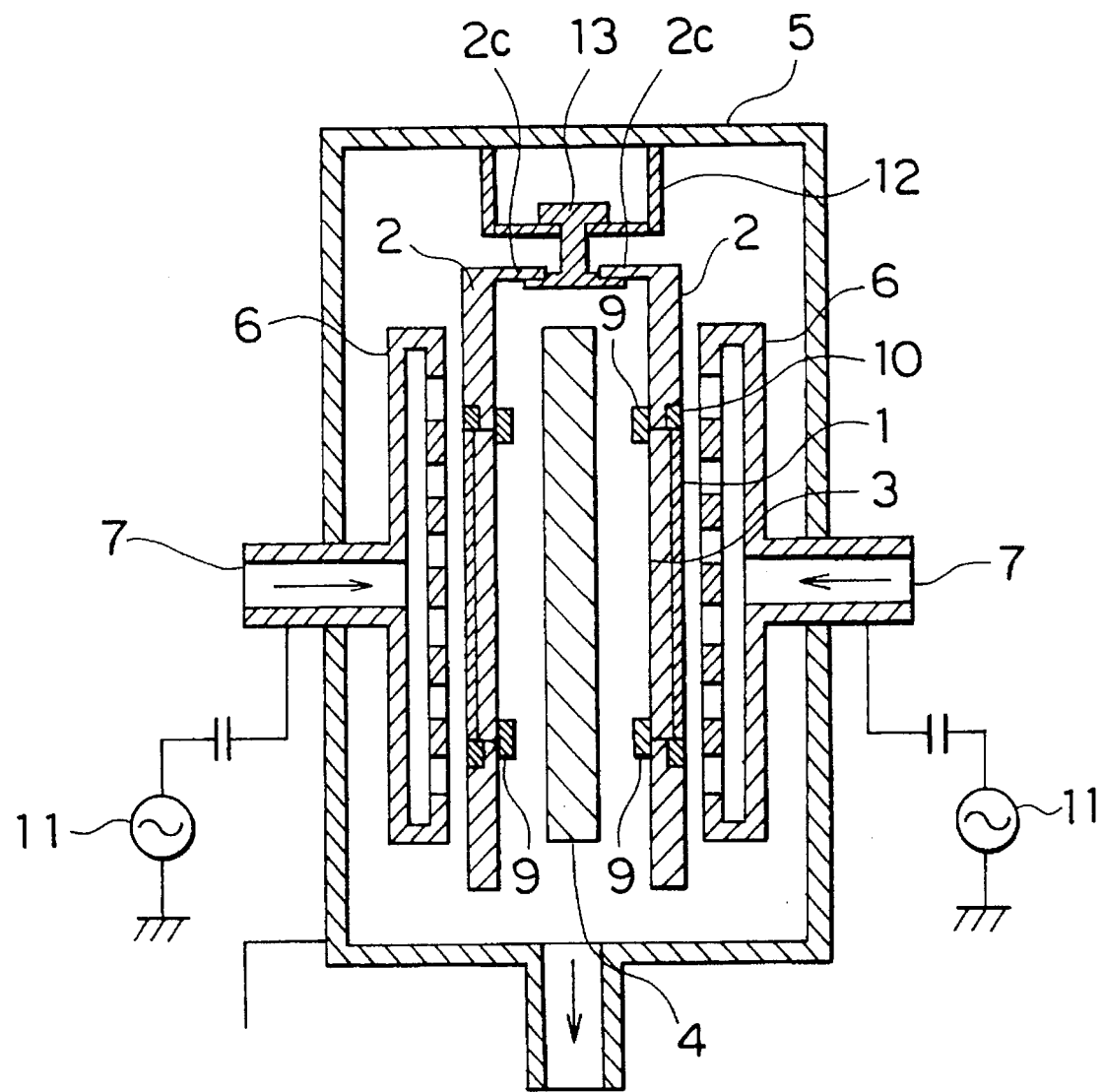
FIG. 6 is a cross-sectional view of a plasma CVD apparatus according to another embodiment of this invention.

FIG. 6 is a diagram showing another embodiment of this invention as adapted to a plasma CVD apparatus of a vertical double-side discharging type. Those components in FIG. 6 which have the same functions as the components shown in FIG. 3 will be given same reference numerals and symbols, and their detailed descriptions will be omitted. In this embodiment, a moving mechanism 12 for the holding electrode 2 is secured to the upper inner wall of the reaction chamber 5. This moving mechanism 12 has a rail 13 suspending therefrom and running horizontally. An engage section 2c is provided at one end portion of the holding electrode 2, so that the holding electrode is suspended from the rail 13 on both sides thereof.

In this embodiment, two holding electrodes 2 for holding the glass substrate 1 are suspended, back to back, from the holding-electrode moving mechanism 12, and the high-frequency electrode 6 is arranged in such a way as to face the holding electrodes 2. The insulating plate 10 shown in FIGS. 4 and 5 is provided in the window of each holding electrode 2. This structure improves the uniformness of the film thickness and productivity of the plasma CVD apparatus.

Although the foregoing description of the embodiments has been given of the case where a rectangular glass substrate is used as the substrate on which a film is to be grown, the substrate may be a quartz plate or other types of insulating plates. The substrate is not limited to a rectangular shape, but may have a circular shape. In other words, the windows which are to be formed in the holding electrode and the insulating plate may have a circular shape or a rectangular shape.

What is claimed is:

1. A plasma CVD apparatus comprising:

a high-frequency electrode connected to a high-frequency power supply;

a holding electrode arranged in parallel to said high-frequency electrode and having a window formed in an area where a substrate on which a film is to be grown is to be secured, said substrate having a front side, on which said film is to be grown, and a back side;

a ring-shaped insulating plate having an outer peripheral portion contactable to said window and an inner peripheral portion forming an opening where said substrate is to be fitted, said insulating plate being detachably attached to said window such that said substrate contacts said inner peripheral portion; and a backing plate for providing uniform heating of said substrate, disposed in contact with and completely covering said back side of said substrate.

2. The plasma CVD apparatus according to claim 1, wherein said insulating plate is made of the same material as said substrate.

3. The plasma CVD apparatus according to claim 1, wherein said insulating plate is made of glass or quartz.

* * * * *